(12) United States Patent
Van Dal et al.

(10) Patent No.: US 11,949,020 B2
(45) Date of Patent: Apr. 2, 2024

(54) TRANSISTOR, INTEGRATED CIRCUIT, AND MANUFACTURING METHOD

(71) Applicant: Taiwan Semiconductor Manufacturing Company, Ltd., Hsinchu (TW)

(72) Inventors: Marcus Johannes Henricus Van Dal, Linden (BE); Blandine Duriez, Brussels (BE); Georgios Vellianitis, Heverlee (BE); Gerben Doornbos, Kessel-Lo (BE); Mauricio Manfrini, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/078,113

(22) Filed: Dec. 9, 2022

(65) Prior Publication Data
US 2023/0111572 A1  Apr. 13, 2023

Related U.S. Application Data

(63) Continuation of application No. 17/076,810, filed on Oct. 22, 2020, now Pat. No. 11,557,678.
(Continued)

(51) Int. Cl.
*H01L 27/12* (2006.01)
*H01L 21/02* (2006.01)
(Continued)

(52) U.S. Cl.
CPC .... *H01L 29/7869* (2013.01); *H01L 21/02565* (2013.01); *H01L 21/02667* (2013.01);
(Continued)

(58) Field of Classification Search
CPC ......... H01L 21/02565; H01L 21/02667; H01L 21/02148; H01L 21/3081; H01L 27/1207; H01L 27/1225; H01L 27/124; H01L 27/1255; H01L 29/7869; H01L 29/66969; H01L 29/78648; H01L 29/78696; H01L 29/24; H01L 21/02; H01L 21/02483; H01L 21/02488; H01L 21/02502; H01L 27/12;
(Continued)

(56) References Cited

U.S. PATENT DOCUMENTS 9,647,136 B2 *   5/2017   Lee ................... H01L 29/7869
10,340,275 B2 *  7/2019   Karpov ............. H01L 29/7869
(Continued)

*Primary Examiner* — Nikolay K Yushin
(74) *Attorney, Agent, or Firm* — JCIPRNET

(57) ABSTRACT

A transistor includes a first gate electrode, a first capping layer, a crystalline semiconductor oxide layer, a second capping layer, a first gate dielectric layer, and source/drain contacts. The first capping layer, the crystalline semiconductor oxide layer, and the second capping layer are sequentially disposed over the first gate electrode. Sidewalls of the second capping layer are aligned with sidewalls of the crystalline semiconductor oxide layer. The first gate dielectric layer is located between the first gate electrode and the first capping layer. The source/drain contacts are disposed on the second capping layer. The crystalline semiconductor oxide layer and the source/drain contacts are located on two opposite sides of the second capping layer.

20 Claims, 15 Drawing Sheets

Related U.S. Application Data

(60) Provisional application No. 63/030,933, filed on May 28, 2020.

(51) Int. Cl.
  *H01L 29/24* (2006.01)
  *H01L 29/66* (2006.01)
  *H01L 29/786* (2006.01)
  *H10B 99/00* (2023.01)

(52) U.S. Cl.
  CPC ...... *H01L 27/1207* (2013.01); *H01L 27/1225* (2013.01); *H01L 27/124* (2013.01); *H01L 27/1255* (2013.01); *H01L 29/24* (2013.01); *H01L 29/66969* (2013.01); *H01L 29/78648* (2013.01); *H01L 29/78696* (2013.01); *H10B 99/00* (2023.02)

(58) Field of Classification Search
  CPC ....... H01L 29/786; H01L 29/66; H01L 29/78; H01L 29/1033; H01L 29/10; H01L 29/7838; H10B 99/00; H10B 99/10; H10B 99/22; H10B 53/30; H10B 53/40; H10B 53/00; H10B 63/30; H10B 63/00; H10B 63/34; H10N 70/20; H10N 70/826; H10N 70/00; H10N 70/8833; H10N 70/8836

See application file for complete search history.

(56) References Cited

U.S. PATENT DOCUMENTS

| | | | |
|---|---|---|---|
| 10,714,633 B2 * | 7/2020 | Yamazaki | H01L 29/045 |
| 2015/0287836 A1 * | 10/2015 | Lee | H01L 27/1225 257/59 |
| 2017/0170332 A1 * | 6/2017 | Yamazaki | H01L 29/7869 |
| 2018/0204842 A1 * | 7/2018 | Karpov | H01L 27/1214 |

* cited by examiner

TRANSISTOR, INTEGRATED CIRCUIT, AND MANUFACTURING METHOD

CROSS-REFERENCE TO RELATED APPLICATION

This application is a continuation application of and claims the priority benefit of a prior application Ser. No. 17/076,810, filed on Oct. 22, 2020, now allowed. The prior application Ser. No. 17/076,810 claims the priority benefit of U.S. provisional application Ser. No. 63/030,933, filed on May 28, 2020. The entirety of each of the above-mentioned patent applications is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
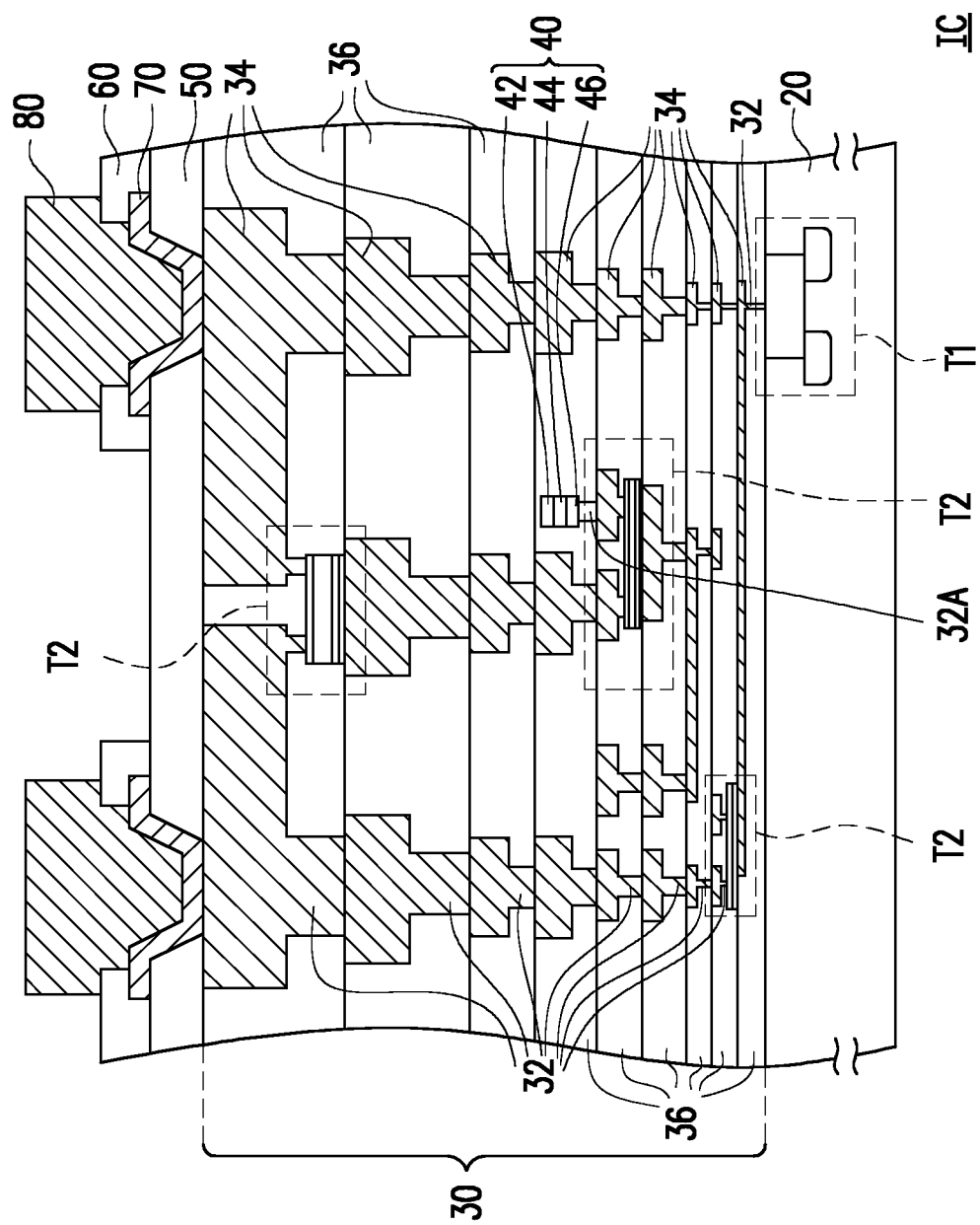
FIG. 1 is a schematic cross-sectional view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of an integrated circuit IC in accordance with some embodiments of the disclosure. In some embodiments, the integrated circuit IC includes a substrate 20, an interconnection structure 30, a passivation layer 50, a post-passivation layer 60, a plurality of conductive pads 70, and a plurality of conductive terminals 80. In some embodiments, the substrate 20 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 20 may be a bulk silicon substrate, a silicon-on-insulator (SOI) substrate, or a germanium-on-insulator (GOI) substrate.

In some embodiments, the substrate 20 includes various doped regions depending on circuit requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. In some embodiments, these doped region may serve as source/drain regions of a first transistor T1 embedded in the substrate 20. Depending on the types of the dopants in the doped regions, the first transistor T1 may be referred to as n-type transistor or p-type transistor. In some embodiments, the first transistor T1 further includes a metal gate and a channel under the metal gate. The channel is located between the source region and the drain region to serve as a path for electron to travel when the first transistor T1 is turned on. In some embodiments, the first transistor T1 may be formed using suitable Front-end-of-line (FEOL) process. Depending on the circuit requirement, the first transistor T1 may be completely embedded in the substrate 20 or partially embedded in the substrate 20. For simplicity, one first transistor T1 is shown in FIG. 1. However, it should be understood that more than one first transistors T1 may be embedded in the substrate 20 depending on the application of the integrated circuit IC. When multiple first transistors T1 are present, these first transistors T1 may be separated by shallow trench isolation (STI; not shown) located between two adjacent first transistors T1. That is, in some embodiments, the STI are also embedded in the substrate 20.

As illustrated in FIG. 1, the interconnection structure 30 is disposed on the substrate 20. In some embodiments, the interconnection structure 30 includes a plurality of conductive vias 32, a plurality of conductive patterns 34, a plurality of dielectric layers 36, a memory cell 40, and a plurality of second transistors T2. As illustrated in FIG. 1, the conductive patterns 34 are embedded in the dielectric layers 36. On the other hand, the conductive vias 32 penetrate through the dielectric layers 36. In some embodiments, the conductive patterns 34 located at different level heights are connected to one another through the conductive vias 32. In other words, the conductive patterns 34 are electrically connected to one another through the conductive vias 32. In some embodiments, the bottommost conductive vias 32 are connected to the first transistor T1 embedded in the substrate 20. In other words, the bottommost conductive vias 32 establish electrical connection between the first transistor T1 and the conductive patterns 34 of the interconnection structure 30. As illustrated in FIG. 1, the bottommost conductive via 32 is connected to the metal gate of the first transistor T1. It should be noted that in some alternative cross-sectional views, the bottommost conductive vias 32 are also connected to source/drain regions of the first transistor T1. That is, in some embodiments, the bottommost conductive vias 32 may be referred to as "contact structures" of the first transistor T1.

In some embodiments, a material of the dielectric layers 36 includes polyimide, epoxy resin, acrylic resin, phenol resin, benzocyclobutene (BCB), polybenzooxazole (PBO), or any other suitable polymer-based dielectric material. Alternatively, the dielectric layers 36 may be formed of oxides or nitrides, such as silicon oxide, silicon nitride, or the like. The dielectric layers 36 may be formed by suitable fabrication techniques such as spin-on coating, chemical vapor deposition (CVD), plasma-enhanced chemical vapor deposition (PECVD), or the like.

In some embodiments, a material of the conductive patterns 34 and the conductive vias 32 includes aluminum, titanium, copper, nickel, tungsten, or alloys thereof. The conductive patterns 34 and the conductive vias 32 may be formed by electroplating, deposition, and/or photolithography and etching. In some embodiments, the conductive patterns 34 and the underlying conductive vias 32 are formed simultaneously. It should be noted that the number of the dielectric layers 36, the number of the conductive patterns 34, and the number of the conductive vias 32 illustrated in FIG. 1 are merely for illustrative purposes, and the disclosure is not limited thereto. In some alternative embodiments, fewer or more layers of the dielectric layers 36, the conductive patterns 34, and/or the conductive vias 32 may be formed depending on the circuit design.

As illustrated in FIG. 1, the memory cell 40 is also embedded in the interconnection structure 30. For example, the memory cell 40 is embedded in the dielectric layers 36. In some embodiments, the memory cell 40 includes a top electrode 42, a storage layer 44, and a bottom electrode 46. The storage layer 44 is sandwiched between the top electrode 42 and the bottom electrode 46. In some embodiments, the memory cell 40 is electrically connected to the underlying conductive pattern 34 through a conductive via 32A located therebetween. In some embodiments, the conductive via 32A is similar to the conductive vias 32, so the detailed descriptions thereof are omitted herein.

In some embodiments, materials of the top electrode 42 and the bottom electrode 46 are identical. However, the disclosure is not limited thereto. In some alternative embodiments, the materials of the top electrode 42 may be different from the material of the bottom electrode 46. The material of the top electrode 42 and the bottom electrode 46 includes, for example, gold, platinum, ruthenium, iridium, titanium, aluminum, copper, tantalum, tungsten, an alloy thereof, an oxide thereof, a nitride thereof, a fluoride thereof, a carbide thereof, a boride thereof, a silicide thereof, or the like.

In some embodiments, the storage layer 44 includes a single or composite film of $HfO_2$, $Hr_{1-x}Zr_xO_2$, $ZrO_2$, $TiO_2$, $NiO$, $TaO_x$, $Cu_2O$, $Nb_2O_5$, $Al_2O_3$, $MoO_x$, $CoO$, $ZnO$, $WO_3$, $V_2O_5$, $Fe_3O_4$, $SrZrO_3$, $SrTiO_3$, $Pr_{1-x}Ca_xMnO_3$, $La_{1-x}Ca_xMnO$, or the like. The storage layer 44 may be formed by CVD, PECVD, flowable chemical vapor deposition (FCVD), high-density-plasma chemical vapor deposition (HDP-CVD), sub-atmospheric chemical vapor deposition (SACVD), physical vapor deposition (PVD), or atomic layer deposition (ALD). Since the storage layer 44 has a variable resistance, the storage layer 44 may be utilized to store data.

In some embodiments, the second transistors T2 are also embedded in the interconnection structure 30. For example, the second transistors T2 are embedded in the dielectric layers 36. As illustrated in FIG. 1, the conductive via 32A directly contacting the memory cell 40 is connected to one of the second transistors T2. In other words, the memory cell 40 is electrically connected to at least one of the second transistors T2. The formation method and the structure of the second transistors T2 will be described in detail later. In some embodiments, the second transistor T2 and the memory cell 40 may be collectively referred to as a memory device. For example, the second transistor T2 may sever as a selector for the memory device. It should be noted that the memory device illustrated in FIG. 1 may be referred to as Resistive Random Access Memory (RRAM) device. However, the disclosure is not limited thereto. In some alternative embodiments, the memory cell 40 may be replaced with other types of memory cell to render Dynamic Random Access Memory (DRAM) device, Static Random Access Memory (SRAM) device, Magnetoresistive Random Access Memory (MRAM), or the like.

As illustrated in FIG. 1, the passivation layer 50, the conductive pads 70, the post-passivation layer 60, and the conductive terminals 80 are sequentially formed on the interconnection structure 30. In some embodiments, the passivation layer 50 is disposed on the topmost dielectric layer 36 and the topmost conductive patterns 34. In some embodiments, the passivation layer 50 has a plurality of openings partially exposing each topmost conductive pattern 34. In some embodiments, the passivation layer 50 may be a silicon oxide layer, a silicon nitride layer, a silicon oxynitride layer, or a dielectric layer formed by other suitable dielectric materials. The passivation layer 50 may be formed by suitable fabrication techniques such as HDP-CVD, PECVD, or the like.

In some embodiments, the conductive pads 70 are formed over the passivation layer 50. In some embodiments, the conductive pads 70 extend into the openings of the passivation layer 50 to be in direct contact with the topmost conductive patterns 34. That is, the conductive pads 70 are electrically connected to the interconnection structure 30. In some embodiments, the conductive pads 70 include aluminum pads, copper pads, titanium pads, nickel pads, tungsten pads, or other suitable metal pads. The conductive pads 70 may be formed by, for example, electroplating, deposition, and/or photolithography and etching. It should be noted that the number and the shape of the conductive pads 70 illustrated in FIG. 1 are merely for illustrative purposes, and the disclosure is not limited thereto. In some alternative embodiments, the number and the shape of the conductive pad 70 may be adjusted based on demand.

In some embodiments, the post-passivation layer 60 is formed over the passivation layer 50 and the conductive pads 70. In some embodiments, the post-passivation layer 60 is formed on the conductive pads 70 to protect the conductive pads 70. In some embodiments, the post-passivation layer 60 has a plurality of contact openings partially exposing each conductive pad 70. The post-passivation layer 60 may be a polyimide layer, a PBO layer, or a dielectric layer formed by other suitable polymers. In some embodiments, the post-passivation layer 60 is formed by suitable fabrication techniques such as HDP-CVD, PECVD, or the like.

As illustrated in FIG. 1, the conductive terminals 80 are formed over the post-passivation layer 60 and the conductive pads 70. In some embodiments, the conductive terminals 80 extend into the contact openings of the post-passivation layer 60 to be in direct contact with the corresponding conductive pad 70. That is, the conductive terminals 80 are electrically connected to the interconnection structure 30 through the conductive pads 70. In some embodiments, the conductive terminals 80 are conductive pillars, conductive posts, conductive balls, conductive bumps, or the like. In some embodiments, a material of the conductive terminals 80 includes a variety of metals, metal alloys, or metals and mixture of other materials. For example, the conductive terminals 80 may be made of aluminum, titanium, copper, nickel, tungsten, tin, and/or alloys thereof. The conductive terminals 80 are formed by, for example, deposition, electroplating, screen printing, or other suitable methods. In some embodiments, the conductive terminals 80 are used to establish electrical connection with other components (not shown) subsequently formed or provided.

As mentioned above, the second transistors T2 are embedded in the interconnection structure 30, and at least one of the second transistors T2 is electrically connected to the memory cell 40. In some embodiments, the second transistors T2 are thin film transistors (TFT). Taking the second transistor T2 located directly underneath the memory cell 40 as an example, the formation method and the structure of this second transistor T2 will be described below in conjunction with FIG. 2A to FIG. 2J and FIG. 3A to FIG. 3J.

FIG. 2A to FIG. 2J are top views illustrating various stages of a manufacturing method of the second transistor T2 in FIG. 1. FIG. 3A to FIG. 3J are cross-sectional views illustrating various stages of the manufacturing method of the second transistor T2 in FIG. 2A to FIG. 2J. It should be noted that the cross-sectional views of FIG. 3A to FIG. 3J are taken along cross-sectional line A-A' in FIG. 2A to FIG. 2J.

Figure 2A:
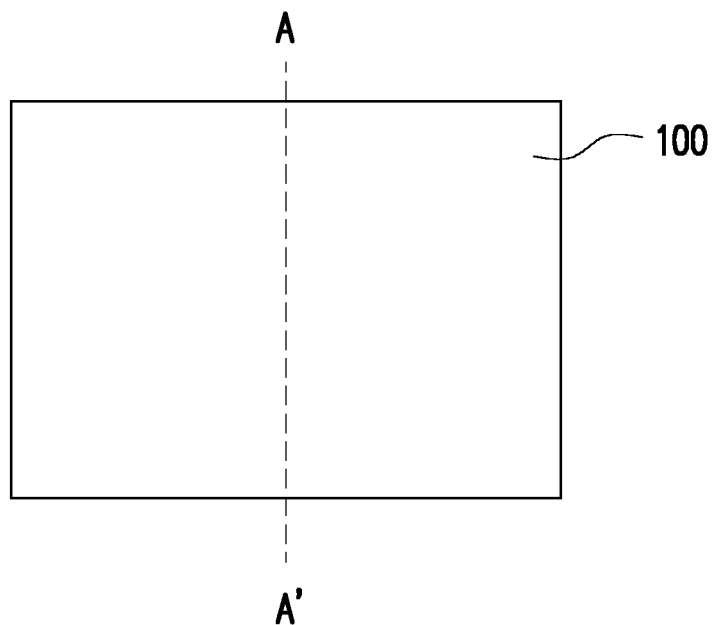
FIG. 2A to FIG. 2J are top views illustrating various stages of a manufacturing method of the second transistor in FIG. 1.
Figure 3A:
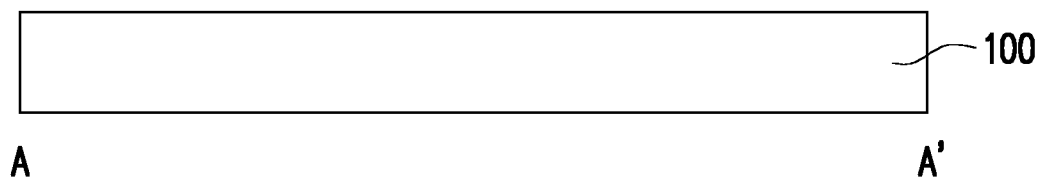
FIG. 3A to FIG. 3J are cross-sectional views illustrating various stages of the manufacturing method of the second transistor in FIG. 2A to FIG. 2J

Referring to FIG. 2A and FIG. 3A, a first dielectric layer 100 is provided. In some embodiments, the first dielectric layer 100 is one of the dielectric layers 36 of the interconnection structure 30 of FIG. 1, so the detailed description thereof is omitted herein.

Figure 2B:
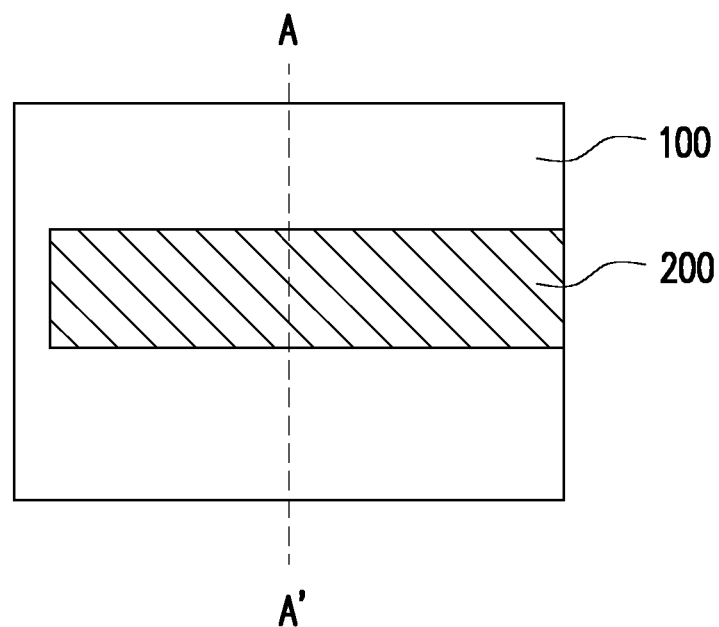
Figure 3B:
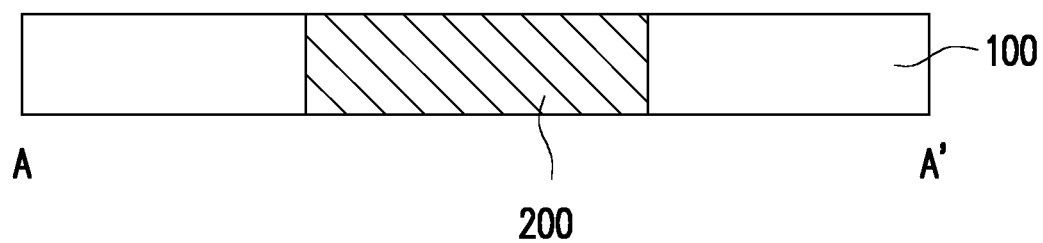

Referring to FIG. 2B and FIG. 3B, a gate electrode 200 is formed in the first dielectric layer 100. The gate electrode 200 may be formed by suitable fabrication techniques such as a damascene gate formation process. In some embodiments, the first dielectric layer 100 is first patterned to form a trench therein. The first dielectric layer 100 may be patterned through a photolithography and etching process. The etching process includes, for example, an anisotropic etching process such as dry etch or an isotropic etching process such as wet etch. In some embodiments, an etchant for the wet etch includes a combination of hydrogen fluoride (HF) and ammonia ($NH_3$), a combination of HF and tetramethylammonium hydroxide (TMAH), or the like. On the other hand, the dry etch process includes, for example, reactive ion etch (RIE), inductively coupled plasma (ICP) etch, electron cyclotron resonance (ECR) etch, neutral beam etch (NBE), and/or the like. Subsequently, a metallic material (not shown) is formed over the first dielectric layer 100 and in the trench of the first dielectric layer 100. In some embodiments, the metallic material is deposited through atomic layer deposition (ALD), CVD, PVD, or the like. Thereafter, a polishing process is performed on the metallic material until the first dielectric layer 100 is exposed, so as to form the gate electrode 200 that is embedded in first dielectric layer 100. The polishing process includes, for example, a mechanical grinding process, a chemical mechanical polishing (CMP) process, or the like.

In some embodiments, the metallic material of the gate electrode 200 includes copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In some embodiments, the gate electrode 200 also includes materials to fine-tune the corresponding work function. For example, the metallic material of the gate electrode 200 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof.

In some embodiments, a barrier layer (not shown) may be optionally formed between the gate electrode 200 and the first dielectric layer 100, so as to avoid diffusion of atoms between elements. In some embodiments, materials of the barrier layer includes titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or a combination thereof.

As illustrated in FIG. 3B, the gate electrode 200 is formed such that the first dielectric layer 100 laterally surrounds the gate electrode 200. In some embodiments, a top surface of the gate electrode 200 is substantially coplanar with a top surface of the first dielectric layer 100. In some embodiments, the gate electrode 200 corresponds to one of the conductive patterns 34 in the interconnection structure 30 of FIG. 1.

Figure 2C:
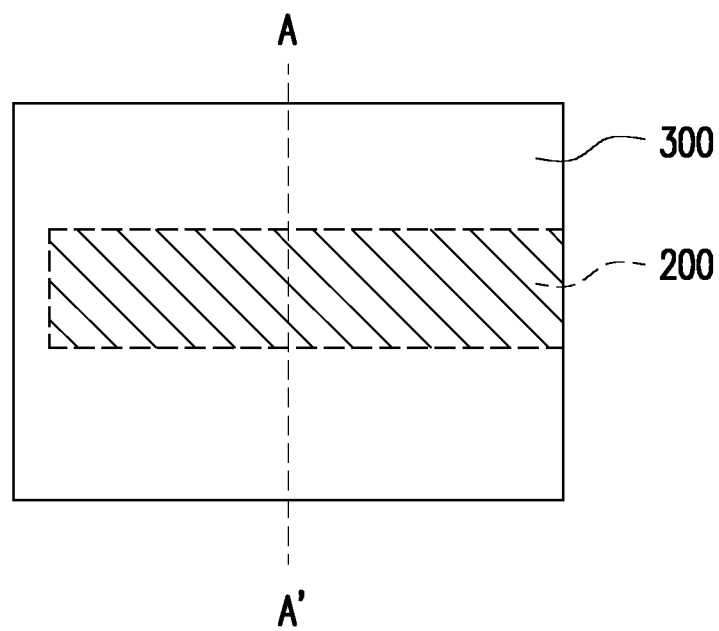
Figure 3C:
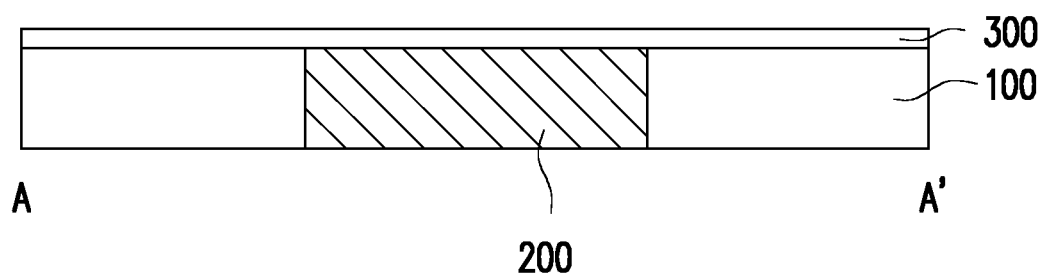

Referring to FIG. 2C and FIG. 3C, a gate dielectric layer 300 is formed over the gate electrode 200 and the first dielectric layer 100. In some embodiments, the gate dielectric layer 300 includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some embodiments, the gate dielectric layer 300 includes metal oxides, metal nitrides, metal silicates, transition metal-oxides, transition metal-nitrides, transition metal-silicates, oxynitrides of metals, metal aluminates, or combinations thereof. For example, the gate dielectric layer 300 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. The gate dielectric layer 300 may be formed by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. In some embodiments, a thickness of the gate dielectric layer 300 ranges from about 0.5 nm to about 10 nm. As illustrated in FIG. 3C, the gate dielectric layer 300 is disposed on the gate electrode 200 and the first dielectric layer 100 such that a portion of the gate dielectric layer 300 is in direct contact with the gate electrode 200 while another portion of the gate dielectric layer 300 is in direct contact with the first dielectric layer 100.

Figure 2D:
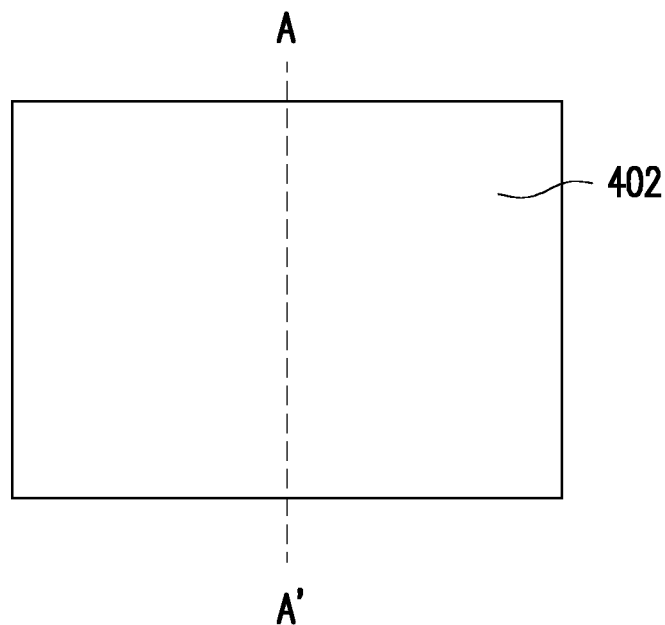
Figure 3D:
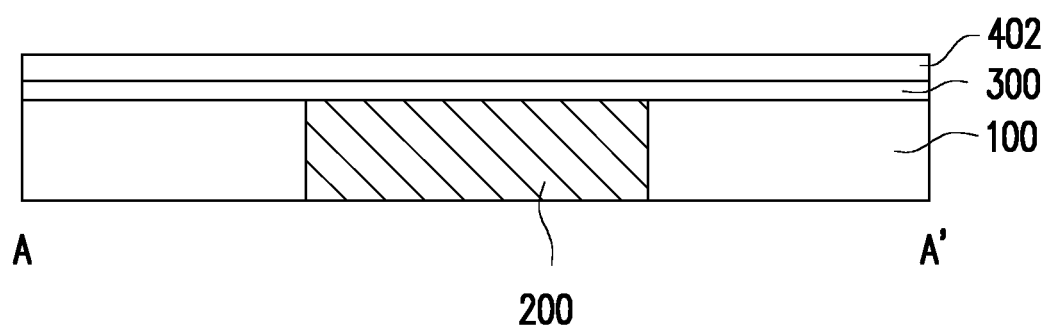

Referring to FIG. 2D and FIG. 3D, a first capping layer 402 is formed on the gate dielectric layer 300. For example, the first capping layer 402 is formed to be in direct contact with the gate dielectric layer 300. In other words, the gate dielectric layer 300 is sandwiched between the first capping layer 402 and the gate electrode 200, and is sandwiched between the first capping layer 402 and the first dielectric layer 100. In some embodiments, the first capping layer 402 includes a ternary or higher (e.g., quaternary and so on) semiconductor oxide material, such as Indium Gallium Zinc Oxide (IGZO), Indium Zinc Oxide (IZO), Indium Tin Oxide (ITO), or the like. In some embodiments, the first capping layer 402 may further include silicon dopants. For example, the first capping layer 402 may be a Si-doped IGZO layer, a Si-doped IZO layer, a Si-doped ITO layer, or the like. In some embodiments, the silicon dopant is able to improve channel stability, as well as seeding and process robustness. In some embodiments, the first capping layer 402 is deposited by suitable techniques, such as CVD, ALD, PVD, PECVD, epitaxial growth, or the like. In some embodiments, the first capping layer 402 is formed to have a thickness of about 1 nm to about 5 nm.

Figure 2E:
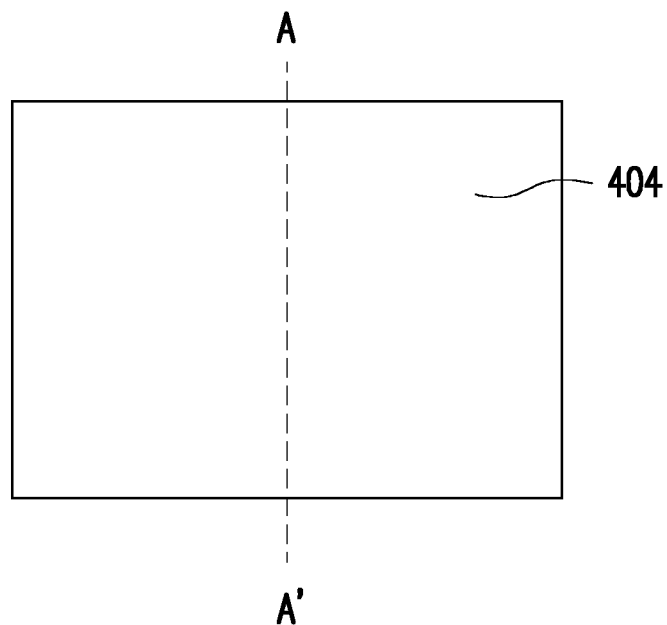
Figure 3E:
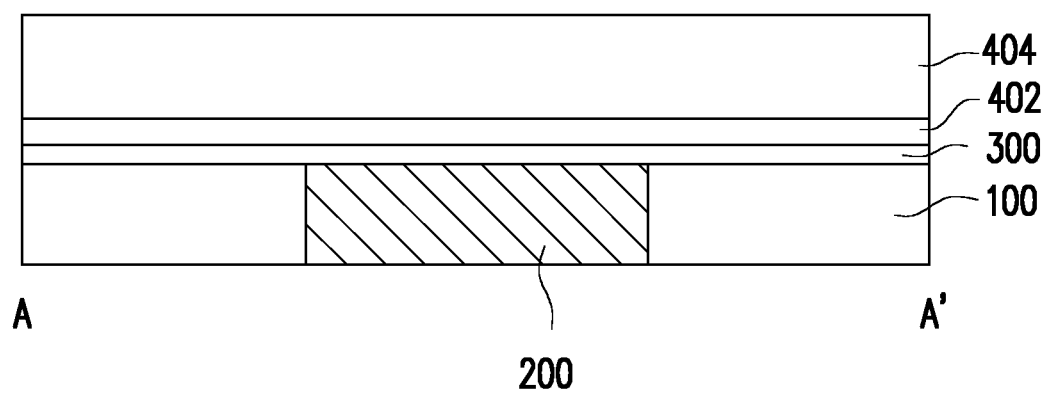

Referring to FIG. 2E and FIG. 3E, a semiconductor oxide layer 404 is formed on the first capping layer 402. For example, the semiconductor oxide layer 404 is formed to be in direct contact with the first capping layer 402. In other words, the first capping layer 402 is sandwiched between the semiconductor oxide layer 404 and the gate dielectric layer 300. In some embodiments, a material of the semiconductor oxide layer 404 includes $Ga_2O_3$, $In_2O_3$, ZnO, $SnO_2$, or the like. In some embodiments, the semiconductor oxide layer 404 includes $\beta$-$Ga_2O_3$. In some embodiments, the semiconductor oxide layer 404 is deposited by suitable techniques, such as CVD, ALD, PVD, PECVD, epitaxial growth, or the like. In some embodiments, the first capping layer 402 is used as a seeding layer for the growth of the semiconductor oxide layer 404. For example, the first capping layer 402 may allow for high quality growth of the semiconductor oxide layer 404 at low temperatures. In some embodiments, the semiconductor oxide layer 404 is formed to have a thickness of about 3 nm to about 50 nm. It should be noted that during this stage, the semiconductor oxide layer 404 is in an amorphous state. That is, the semiconductor oxide layer 404 is an amorphous semiconductor oxide layer at this stage.

Figure 2F:
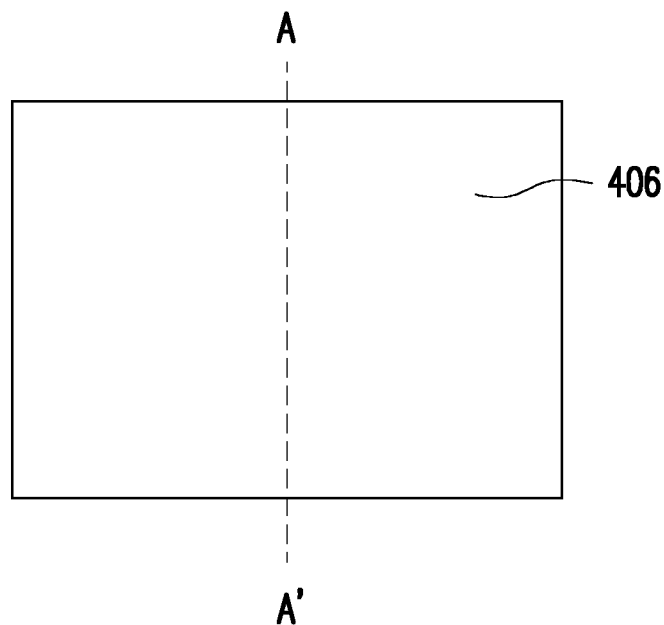
Figure 3F:
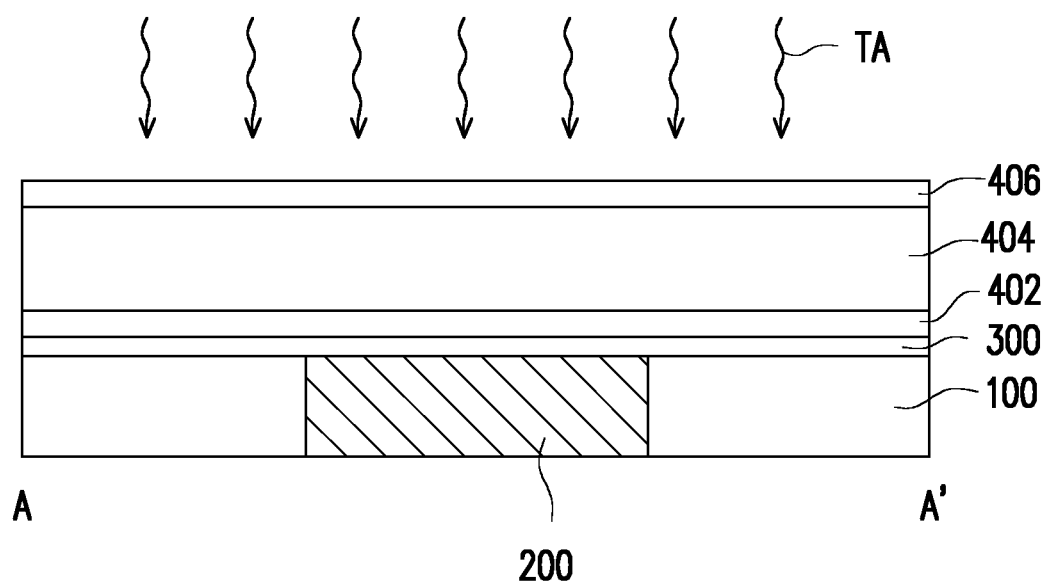
Figure 2G:
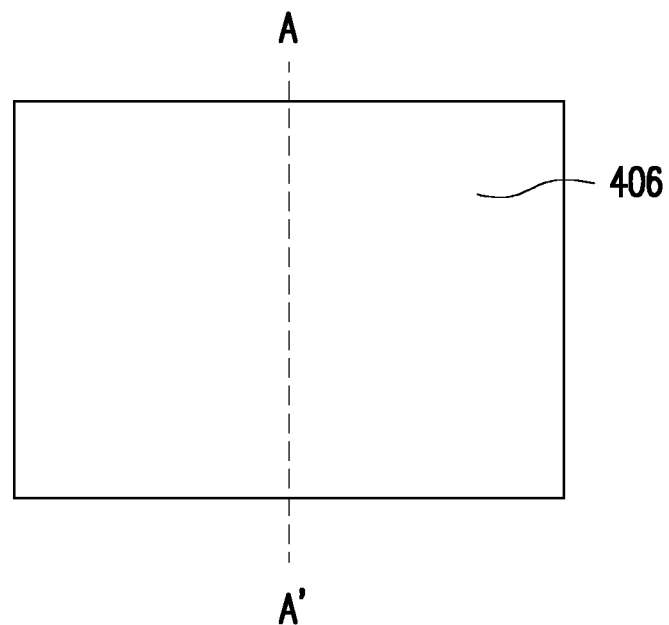

Referring to FIG. 2F and FIG. 3F, a second capping layer 406 is formed on the semiconductor oxide layer 404. For example, the second capping layer 406 is formed to be in direct contact with the semiconductor oxide layer 404. In other words, the semiconductor oxide layer 404 is sandwiched between the first capping layer 402 and the second capping layer 406. As illustrated in FIG. 3F, the gate dielectric layer 300, the first capping layer 402, the semiconductor oxide layer 404, and the second capping layer 406 are sequentially deposited over the first dielectric layer 100 and the gate electrode 200. In some embodiments, a material of the second capping layer 406 is identical to the material of the first capping layer 402. However, the disclosure is not limited thereto. In some alternative embodiments, the material of the second capping layer 406 may be different from the material of the first capping layer 402. In some embodiments, the second capping layer 406 includes a ternary or higher (e.g., quaternary and so on) semiconductor oxide material, such as IGZO, IZO, ITO, or the like. In some embodiments, the second capping layer 406 may further include silicon dopants. For example, the second capping layer 406 may be a Si-doped IGZO layer, a Si-doped IZO layer, a Si-doped ITO layer, or the like. In some embodiments, the second capping layer 406 is deposited by suitable techniques, such as CVD, ALD, PVD, PECVD, epitaxial growth, or the like. Similar to the first capping layer 402, the second capping layer 406 is also formed to have a thickness of about 1 nm to about 5 nm.

Referring to FIGS. 2F-2G and FIG. 3F-3G, after the second capping layer 406 is formed on the semiconductor oxide layer 404, a thermal annealing process TA is performed on the structure illustrated in FIG. 3F. For example, the thermal annealing process TA is performed on the semiconductor oxide layer 404 to alter the crystallinity of the semiconductor oxide layer 404, so as to form a crystalline semiconductor oxide layer 404A (shown in FIG. 3G). In some embodiments, due to the crystallinity of the first capping layer 402 and the second capping layer 406, the phase change process of the semiconductor oxide layer 404 located between the first capping layer 402 and the second capping layer 406 can be performed at a low temperature. That is, the thermal annealing process TA is performed at a low temperature. For example, the thermal annealing process TA is performed at a temperature ranging from about 300° C. to about 600° C. In some embodiments, a duration of the thermal annealing process TA lasts from about 1 minute to about 24 hours. As mentioned above, the semiconductor oxide layer 404 is in an amorphous state, which generally exhibits greater resistivity than the crystalline state. On the other hand, the crystalline semiconductor oxide layer 404A, due to its higher crystallinity in comparison to the amorphous semiconductor oxide layer 404, results in higher channel mobility. In other words, by performing the thermal annealing process TA to alter the crystallinity of the semiconductor oxide layer 404, the channel mobility of the subsequently formed second transistor T2 may be sufficiently increased, thereby leading to higher device performance. Furthermore, as mentioned above, the second transistor T2 is embedded in the interconnection structure 30, which is being considered as formed during back-end-of-line (BEOL) process. In some embodiments, the thermal budget (i.e. the process temperature window) for BEOL process is low. As a result, it is difficult to achieve the required material crystallinity quality by simple deposition of the semiconductor oxide layer within the thermal budget constraints given by BEOL process in conventional transistors. That is, conventionally, a high temperature process is required to be performed to alter the crystallinity of the semiconductor oxide layer; however, the high temperature is not compatible with BEOL process. On the contrary, as mentioned above, with the aid of the first capping layer 402 and the second capping layer 406 on two opposite sides of the semiconductor oxide layer 404, the crystallinity of the semiconductor oxide layer 404 may be altered by a low temperature process (thermal annealing process TA), which is compatible with BEOL thermal budget.

As illustrated in FIG. 3F, the thermal annealing process TA is performed after the second capping layer 406 is deposited on the semiconductor oxide layer 404. However, the disclosure is not limited thereto. In some alternative embodiments, the thermal annealing process TA is performed before the second capping layer 406 is deposited on the semiconductor oxide layer 404. For example, the thermal annealing process TA is performed on the structure shown in FIG. 3E. That is, the thermal annealing process TA may be performed before or after the formation of the second capping layer 406. In some embodiments, the thermal annealing process TA is performed twice. For example, the thermal annealing process TA is performed both before and after the second capping layer 406 is formed. That is, the thermal annealing process TA may be first performed on the structure shown in FIG. 3E. Subsequently, another thermal annealing process TA may be performed on the structure shown in FIG. 3F.

Figure 3G:
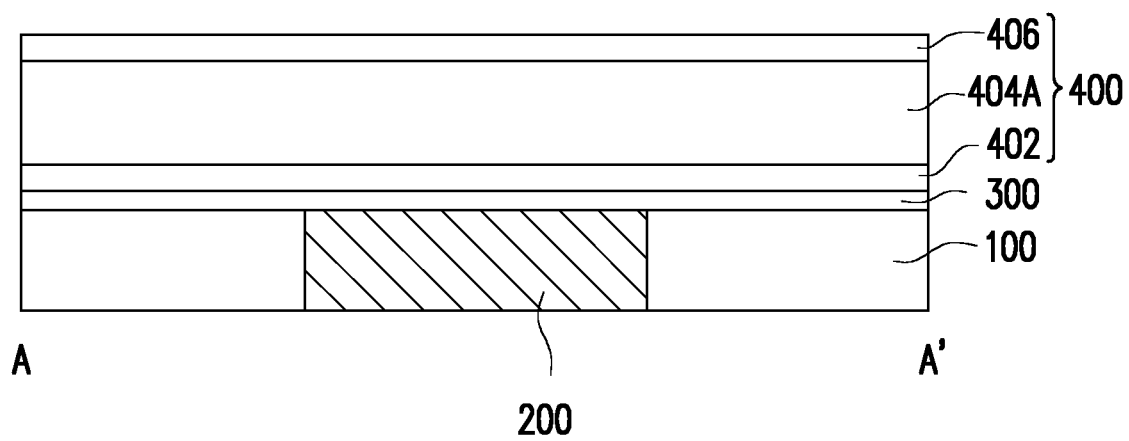

In some embodiments, the first capping layer 402, the crystalline semiconductor oxide layer 404A, and the second capping layer 406 are stacked in sequential order to form a composite channel layer 400. As illustrated in FIG. 3G, the composite channel layer 400 is disposed over the first dielectric layer 100, the gate electrode 200, and the gate dielectric layer 300. In other words, the gate dielectric layer 300 is located between the gate electrode 200 and the composite channel layer 400. For example, the gate dielectric layer 300 is sandwiched between the gate electrode 200 and the composite channel layer 400.

Figure 2H:
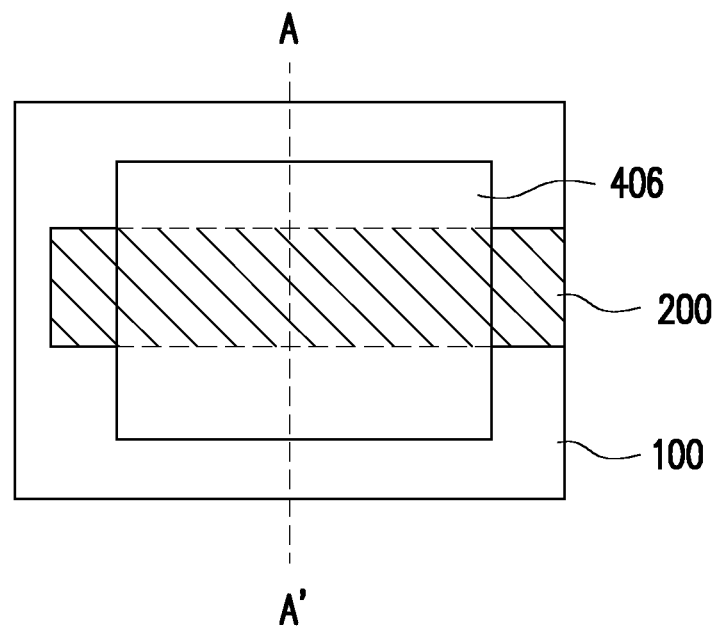
Figure 3H:
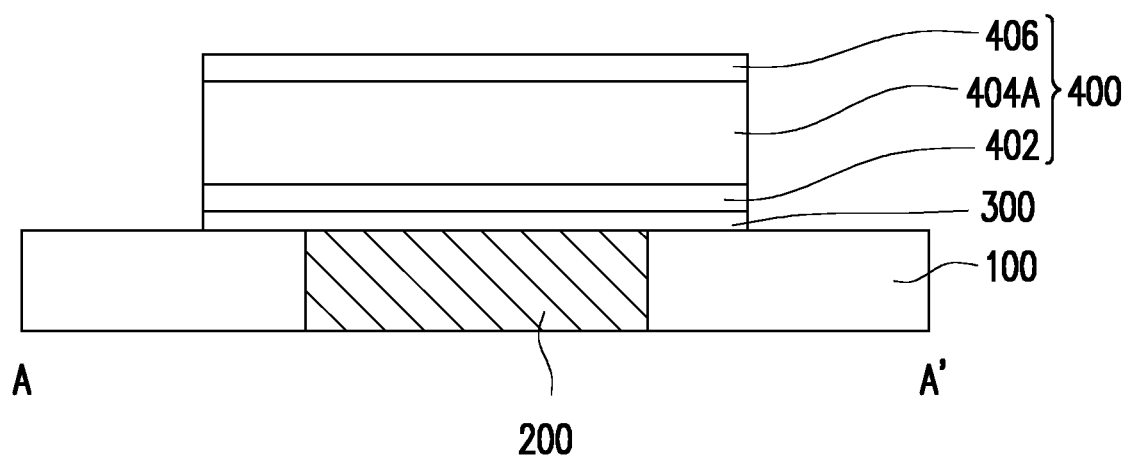

Referring to FIG. 2H and FIG. 3H, the composite channel layer 400 and the gate dielectric layer 300 are partially removed. In some embodiments, the composite channel layer 400 and the gate dielectric layer 300 are partially removed through a lithography process and an etching process. The lithography process includes, for example, photoresist coating, soft baking, exposing, post-exposure baking (PEB), developing, and hard baking. The etching process includes, for example, an isotropic etching process and/or an anisotropic etching process. For example, the composite channel layer 400 and the gate dielectric layer 300 may be partially removed through a wet etching process, a drying etching process, or a combination thereof.

As illustrated in FIG. 2H and FIG. 3H, a width of the remaining composite channel layer 400 and a width of the remaining gate dielectric layer 300 are larger than a width of the gate electrode 200. In some embodiments, the width of the remaining composite channel layer 400 is substantially equal to the width of the remaining gate dielectric layer 300. For example, sidewalls of the gate dielectric layer 300, sidewalls of the first capping layer 402, sidewalls of the crystalline semiconductor oxide layer 404A, and sidewalls of the second capping layer 406 are aligned.

Figure 2I:
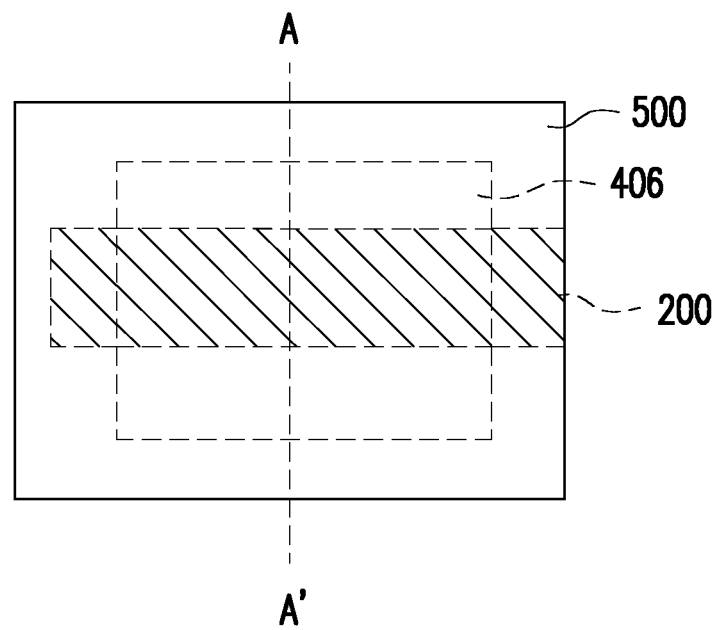
Figure 3I:
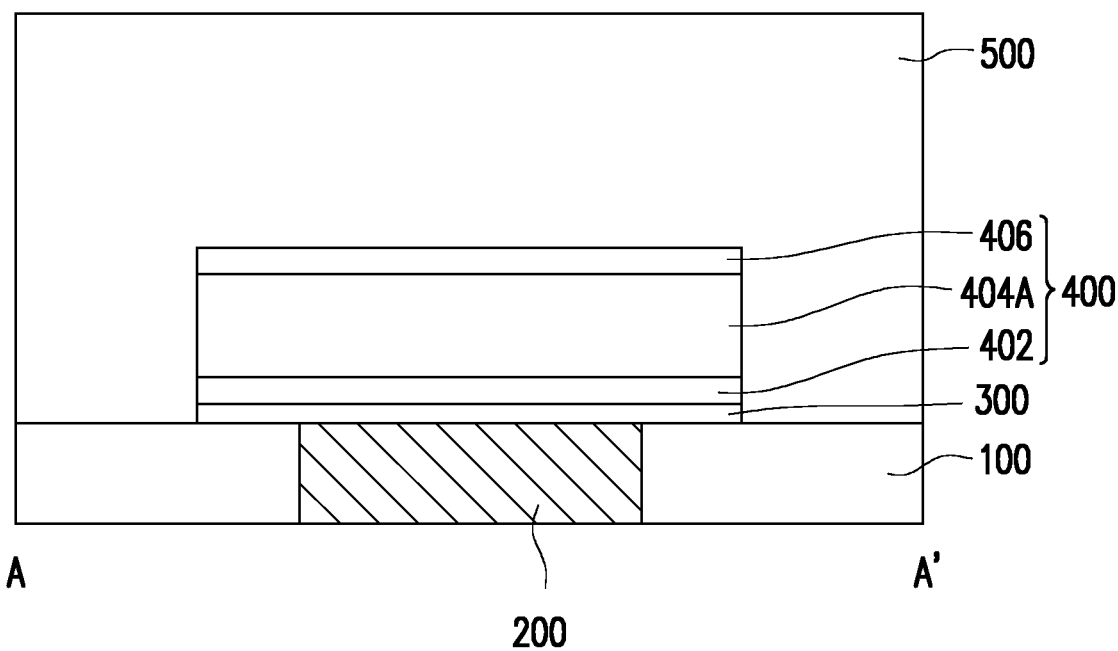

Referring to FIG. 2I and FIG. 3I, a second dielectric layer 500 is formed over the first dielectric layer 100, the gate dielectric layer 300, and the composite channel layer 400. In some embodiments, the second dielectric layer 500 covers the composite channel layer 400 and the gate dielectric layer 300. In other words, the composite channel layer 400 and the gate dielectric layer 300 are well protected and not exposed by the second dielectric layer 500. As mentioned above, the first dielectric layer 100 is one of dielectric layers 36 of the interconnection structure 30 of FIG. 1. Similarly, the second dielectric layer 500 is another one of the dielectric layers 36 of the interconnection structure 30 of FIG. 1, so the detailed description thereof is omitted herein. In some embodiments, the material of the first dielectric layer 100 and the material of the second dielectric layer 500 are identical. However, the disclosure is not limited thereto. In some alternative embodiments, the material of the first dielectric layer 100 may be different from the material of the second dielectric layer 500.

Figure 2J:
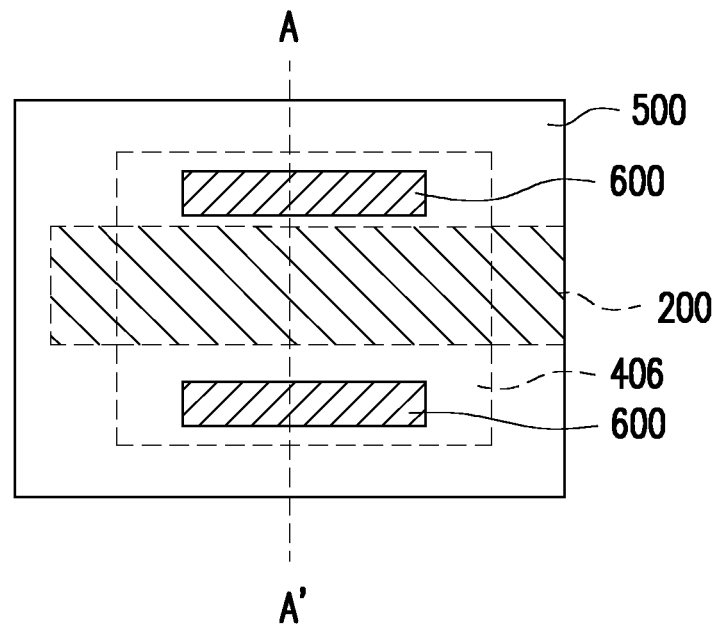
Figure 3J:
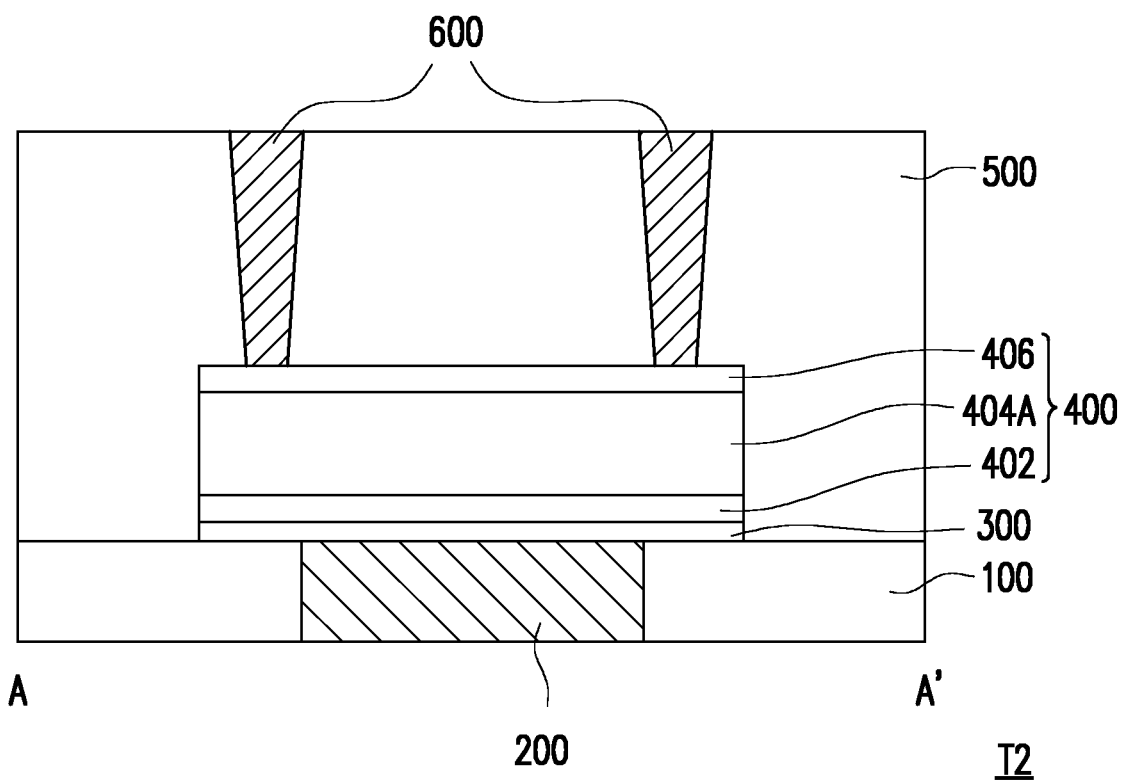

Referring to FIG. 2J and FIG. 3J, source/drain contacts 600 are formed on the composite channel layer 400. In some embodiments, the source/drain contacts 600 penetrate through the second dielectric layer 500 to be in direct contact with the second capping layer 406 of the composite channel layer 400. In some embodiments, the source/drain contacts 600 are formed by the following steps. First, source/drain openings are formed through the second dielectric layer 500 near two ends of the composite channel layer 400. In some embodiments, the source/drain openings extend from a top surface of the second dielectric layer 500 to a top surface of the composite channel layer 400. That is, the source/drain openings penetrate through the second dielectric layer 500 to partially expose the second capping layer 406 of the composite channel layer 400. After the source/drain openings are formed, a metallic material is filled into the source/drain openings, so as to form the source/drain contacts 600. In some embodiments, the metallic material of the source/drain contacts 600 includes cobalt, tungsten, copper, titanium, tantalum, aluminum, zirconium, hafnium, a combination thereof, or other suitable metallic materials. In some embodiments, the metallic material of the source/drain contacts 600 is formed through CVD, ALD, plating, or other suitable deposition techniques. In some embodiments, the source/drain contacts 600 may serve as the source and the drain of the second transistor T2. However, the disclosure is not limited thereto. In some alternative embodiments, source/drain patterns may be formed between the composite channel layer 400 and the source/drain contacts 600. Under this scenario, the source/drain patterns serve as the source and the drain of the second transistor T2, and the source/drain contacts 600 serve as contact plugs for transmitting signal between the source/drain patterns and other components.

After the source/drain contacts 600 are formed, the formation of the second transistor T2 is substantially completed. As illustrated in FIG. 3J, the second transistor T2 includes the first dielectric layer 100, the gate electrode 200, the gate dielectric layer 300, the composite channel layer 400, the second dielectric layer 500, and the source/drain contacts 600. The gate electrode 200 is embedded in the first dielectric layer 100. The second dielectric layer 500 is stacked on the first dielectric layer 100. The gate dielectric layer 300, the composite channel layer 400, and the source/drain contacts 600 are sequentially disposed on the first dielectric layer 100 and the gate electrode 200. The gate dielectric layer 300, the composite channel layer 400, and the source/drain contacts 600 are embedded in the second dielectric layer 500. In some embodiments, the second transistor T2 may be referred to as a bottom gate transistor or a back gate transistor.

Referring to FIG. 1 and FIG. 3J, the source/drain contacts 600 extend from the composite channel layer 400 to the conductive pads 34 of the interconnection structure 30. In other words, the second transistors T2 is electrically connected to the first transistor T1 and the conductive terminals 80 through the conductive vias 32 and the conductive patterns 34 of the interconnection structure 30.

As mentioned above, the second transistors T2 may be a selector for a memory device. However, the disclosure is not limited thereto. In some alternative embodiments, the second transistors T2 may be power gates used to switch off logic blocks in standby or input/output (I/O) devices acting as the interface between a computing element (such as a CPU) and an external component (such as a hard drive).

Figure 4A:
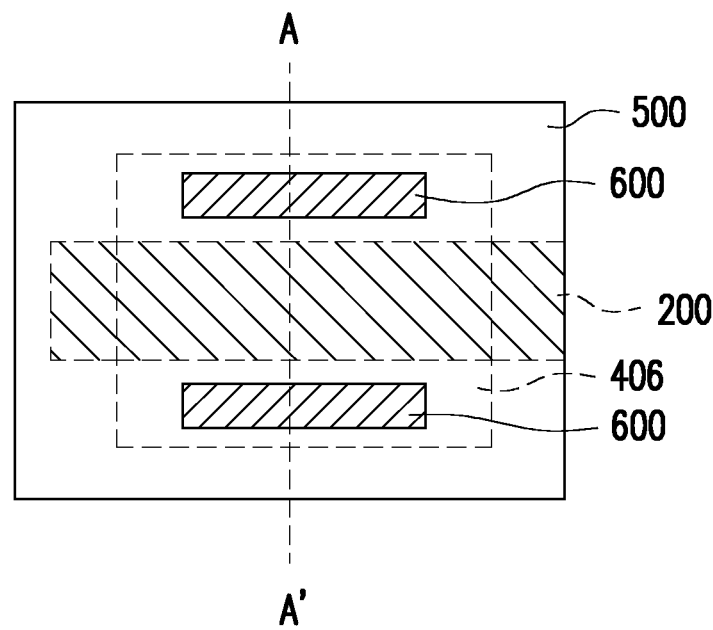
FIG. 4A is a top view of a second transistor in accordance with some alternative embodiments of the disclosure.
Figure 4B:
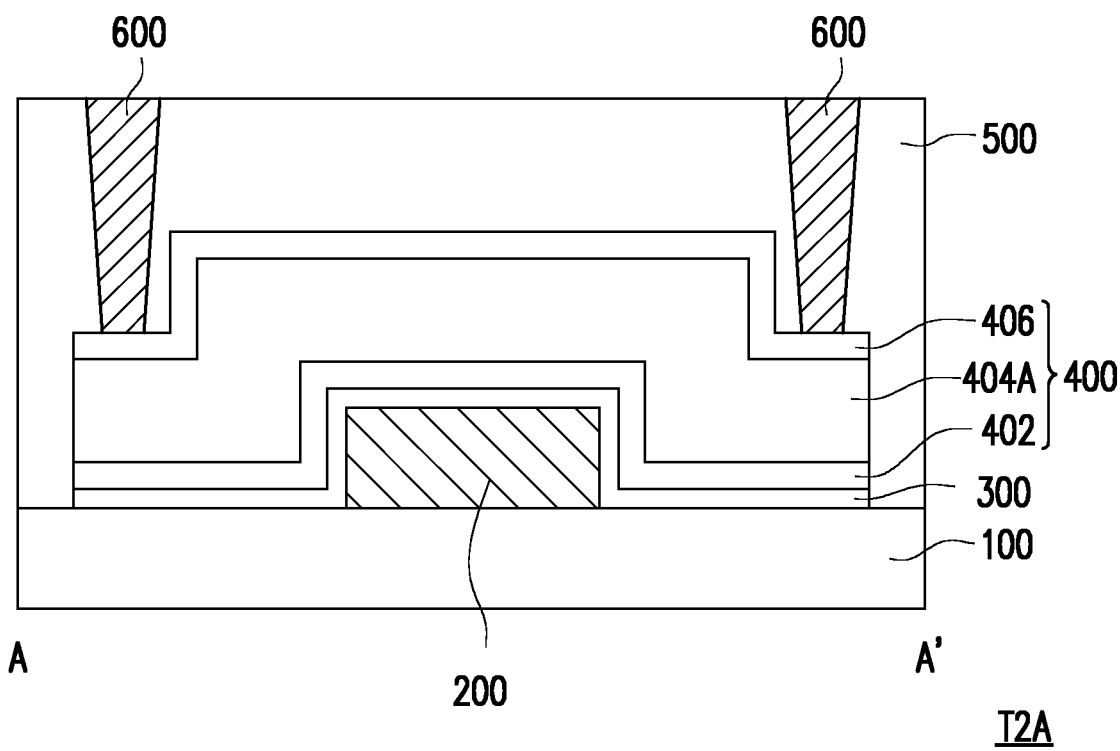
FIG. 4B is a cross-sectional view of the second transistor in FIG. 4A.

FIG. 4A is a top view of a second transistor T2A in accordance with some alternative embodiments of the disclosure. FIG. 4B is a cross-sectional view of the second transistor T2A in FIG. 4A. It should be noted that the cross-sectional views of FIG. 4B is taken along cross-sectional line A-A' in FIG. 4A.

Referring to FIG. 4A and FIG. 4B, the second transistor T2A in FIG. 4A and FIG. 4B is similar to the second transistor T2 in FIG. 2J and FIG. 3J, so similar elements are denoted by the same reference numerals and the detailed descriptions thereof are omitted herein. The difference between the second transistor T2A of FIG. 4A and FIG. 4B and the second transistor T2 of FIG. 2J and FIG. 3J lies in that in the second transistor T2A of FIG. 4A and FIG. 4B, the gate electrode 200 is disposed on a top surface of the first dielectric layer 100 such that the gate electrode 200 is protruding from the top surface of the first dielectric layer 100. In some embodiments, the gate dielectric layer 300 and the composite channel layer 400 are disposed on the first dielectric layer 100 and the gate electrode 200 in a conformal manner. That is, the gate dielectric layer 300 and the composite channel layer 400 follow a profile formed by the combination of the first dielectric layer 100 and the gate electrode 200. In some embodiments, a portion of the gate dielectric layer 300 that is directly in contact with the gate electrode 200 is located at different level height from that of another portion of the gate dielectric layer 300 that is directly in contact with the first dielectric layer 100. For example, the portion of the gate dielectric layer 300 that is directly in contact with the gate electrode 200 is located at a level height higher than the portion of the gate dielectric layer 300 that is directly in contact with the first dielectric layer 100. In some embodiments, a portion of a top surface of the second capping layer 406 is located at a first level height and another portion of the top surface of the second capping layer 406 is located at a second level height higher than the first level height. As illustrated in FIG. 4B, the source/drain contacts 600 are landed on the portion of the top surface of the second capping layer 406 located at the first level height. In some embodiments, the gate dielectric layer 300 and the composite channel layer 400 respectively resemble a reversed U shape. In some embodiments, the second transistor T2A may be referred to as a bottom gate transistor or a back gate transistor. In some embodiments, the second transistor T2A in FIG. 4A and FIG. 4B may be utilized as the second transistor T2 in FIG. 1.

Figure 5A:
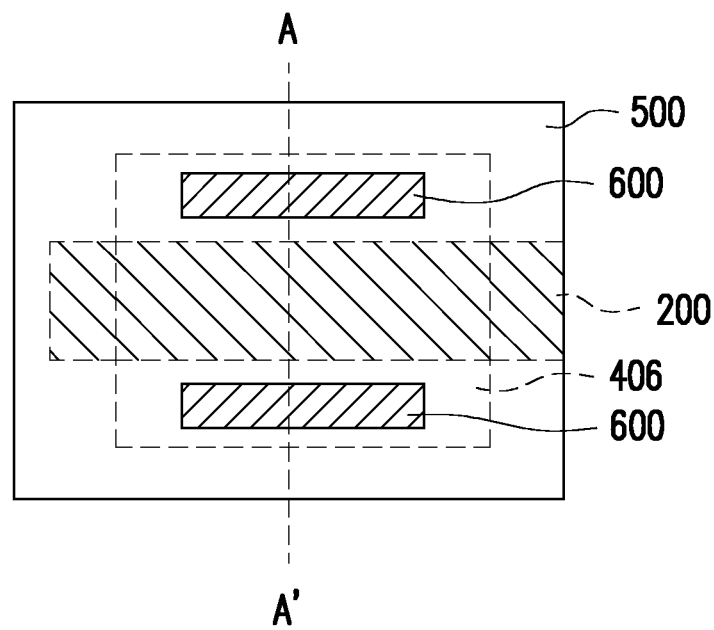
FIG. 5A is a top view of a second transistor in accordance with some alternative embodiments of the disclosure.
Figure 5B:
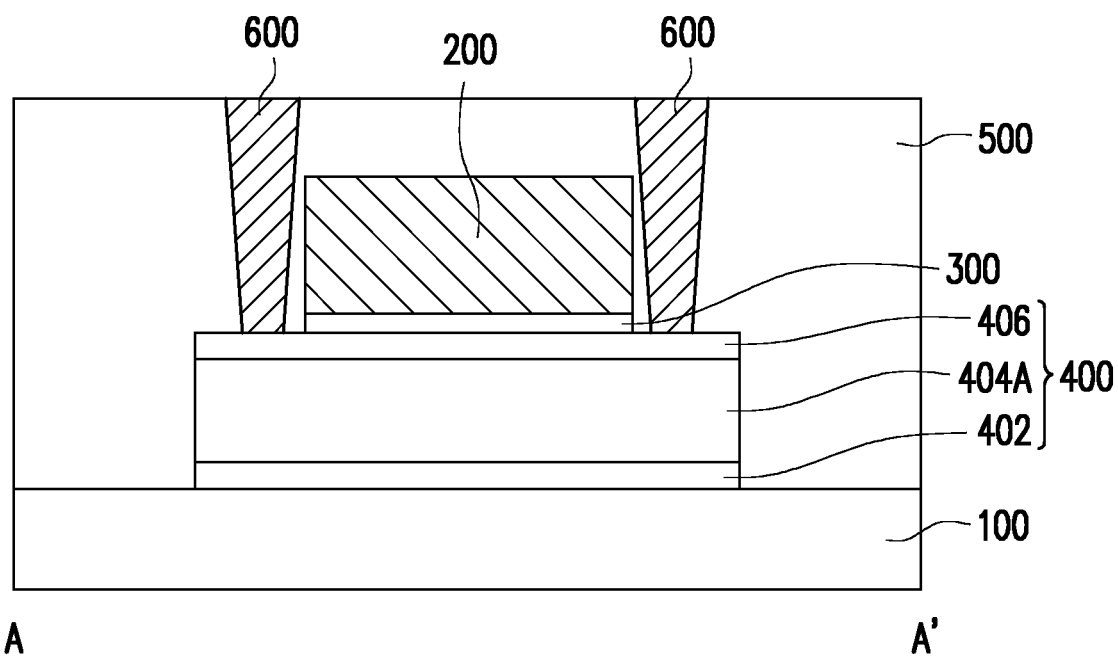
FIG. 5B is a cross-sectional view of the second transistor in FIG. 5A.

FIG. 5A is a top view of a second transistor T2B in accordance with some alternative embodiments of the disclosure. FIG. 5B is a cross-sectional view of the second transistor T2B in FIG. 5A. It should be noted that the cross-sectional views of FIG. 5B is taken along cross-sectional line A-A' in FIG. 5A.

Referring to FIG. 5A and FIG. 5B, the second transistor T2B in FIG. 5A and FIG. 5B is similar to the second transistor T2 in FIG. 2J and FIG. 3J, so similar elements are denoted by the same reference numerals and the detailed descriptions thereof are omitted herein. The difference between the second transistor T2B of FIG. 5A and FIG. 5B and the second transistor T2 of FIG. 2J and FIG. 3J lies in that in the second transistor T2B of FIG. 5A and FIG. 5B, the gate dielectric layer 300 and the gate electrode 200 are disposed above the composite channel layer 400. In some embodiments, the gate dielectric layer 300 and the gate electrode 200 are sequentially disposed on the composite channel layer 400. For example, the gate dielectric layer 300 is sandwiched between the gate electrode 200 and the composite channel layer 400. In some embodiments, the gate dielectric layer 300 is directly in contact with the composite channel layer 400. For example, the gate dielectric layer 300 is directly in contact with the second capping layer 406 of the composite channel layer 400. In some embodiments, the gate dielectric layer 300 and the gate electrode 200 are located between the source/drain contacts 600. As illustrated in FIG. 5B, the gate electrode 200, the gate dielectric layer 300, the composite channel layer 400, and the source/drain contacts 600 are embedded in the second dielectric layer 500. In some embodiments, the second transistor T2B may be referred to as a top gate transistor or a front gate transistor. In some embodiments, the second transistor T2B in FIG. 5A and FIG. 5B may be utilized as the second transistor T2 in FIG. 1.

Figure 6A:
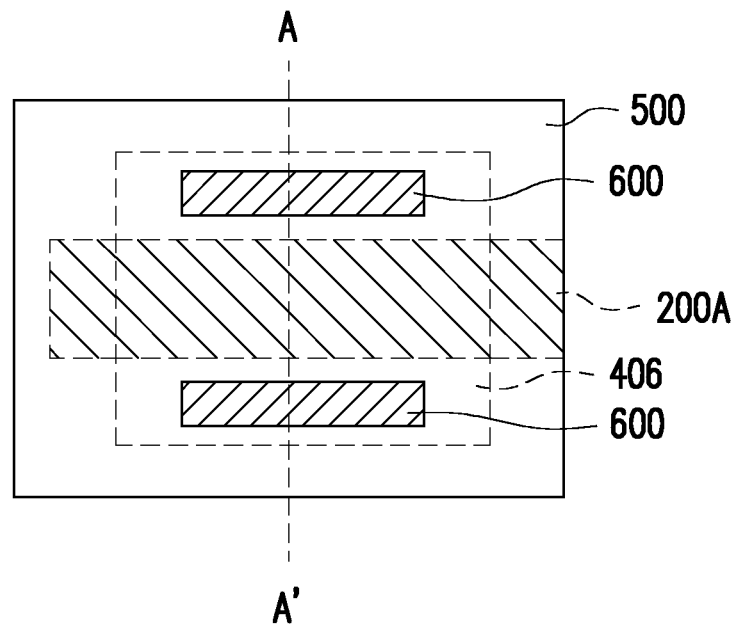
FIG. 6A is a top view of a second transistor in accordance with some alternative embodiments of the disclosure.
Figure 6B:
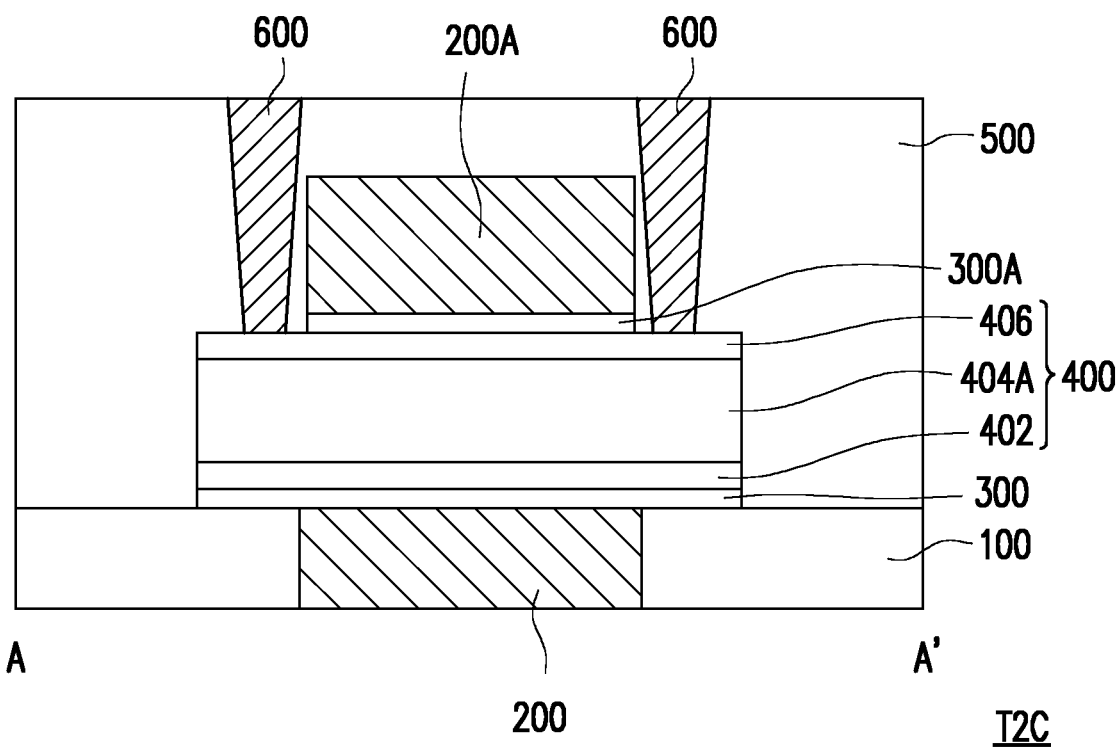
FIG. 6B is a cross-sectional view of the second transistor in FIG. 6A.

FIG. 6A is a top view of a second transistor T2C in accordance with some alternative embodiments of the disclosure. FIG. 6B is a cross-sectional view of the second transistor T2C in FIG. 6A. It should be noted that the cross-sectional views of FIG. 6B is taken along cross-sectional line A-A' in FIG. 6A.

Referring to FIG. 6A and FIG. 6B, the second transistor T2C in FIG. 6A and FIG. 6B is similar to the second transistor T2 in FIG. 2J and FIG. 3J, so similar elements are denoted by the same reference numerals and the detailed descriptions thereof are omitted herein. The difference between the second transistor T2C of FIG. 6A and FIG. 6B and the second transistor T2 of FIG. 2J and FIG. 3J lies in that the second transistor T2C further includes a gate electrode 200A and a gate dielectric layer 300A. In some embodiments, formation methods and materials of the gate electrode 200A and the gate dielectric layer 300A are respectively similar to that of the gate electrode 200 and the gate dielectric layer 300 in FIGS. 2A-2B and FIGS. 3A-3B, so the detailed descriptions thereof are omitted herein. In some embodiments, the gate dielectric layer 300A and the gate electrode 200A are sequentially disposed on the composite channel layer 400. For example, the gate dielectric layer 300A is sandwiched between the gate electrode 200A and the composite channel layer 400. In some embodiments, the gate dielectric layer 300A is directly in contact with the composite channel layer 400. For example, the gate dielectric layer 300A is directly in contact with the second capping layer 406 of the composite channel layer 400. In some embodiments, the gate dielectric layer 300A and the gate electrode 200A are located between the source/drain contacts 600. In some embodiments, a width of the gate electrode 200A is substantially equal to a width of the gate dielectric layer 300A. For example, sidewalls of the gate electrode 200A and sidewalls of the gate dielectric layer 300A are aligned. In some embodiments, a width of the gate electrode 200 is larger than the width of the gate electrode 200A. However, the disclosure is not limited thereto. In some alternative embodiments, the width of the gate electrode 200 may be smaller than or equal to the width of the gate electrode 200A. As illustrated in FIG. 6B, the gate electrode 200 is embedded in the first dielectric layer 100. On the other hand, the gate electrode 200A, the gate dielectric layer 300A, the composite channel layer 400, and the source/drain contacts 600 are embedded in the second dielectric layer 500. In some embodiments, the second transistor T2C may be referred to as a double gate transistor or a dual gate transistor. In some embodiments, the second transistor T2C in FIG. 6A and FIG. 6B may be utilized as the second transistor T2 in FIG. 1.

Figure 7A:
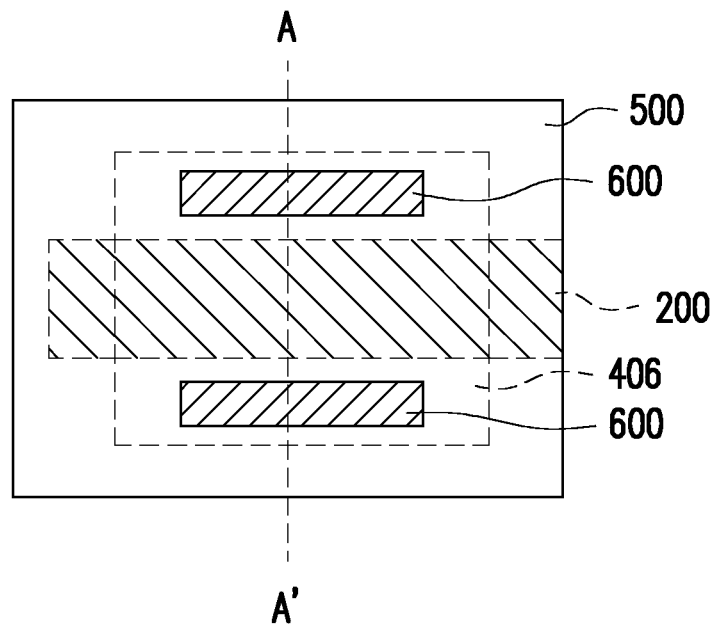
FIG. 7A is a top view of a second transistor in accordance with some alternative embodiments of the disclosure.
Figure 7B:
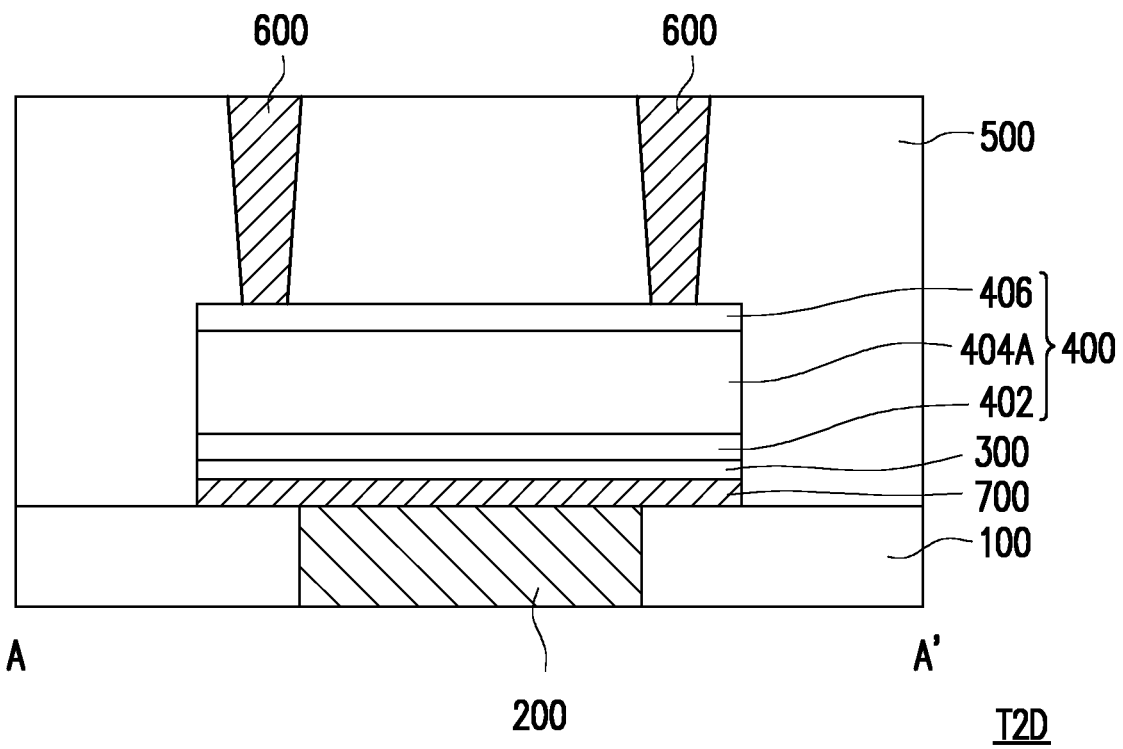
FIG. 7B is a cross-sectional view of the second transistor in FIG. 7A.

FIG. 7A is a top view of a second transistor T2D in accordance with some alternative embodiments of the disclosure. FIG. 7B is a cross-sectional view of the second transistor T2D in FIG. 7A. It should be noted that the cross-sectional views of FIG. 7B is taken along cross-sectional line A-A' in FIG. 7A.

Referring to FIG. 7A and FIG. 7B, the second transistor T2D in FIG. 7A and FIG. 7B is similar to the second transistor T2 in FIG. 2J and FIG. 3J, so similar elements are denoted by the same reference numerals and the detailed descriptions thereof are omitted herein. The difference between the second transistor T2D of FIG. 7A and FIG. 7B and the second transistor T2 of FIG. 2J and FIG. 3J lies in that in the second transistor T2D further includes a seed layer 700. In some embodiments, the seed layer 700 is disposed on the gate electrodes 200 and the first dielectric layer 100 such that a portion of the seed layer 700 is directly in contact with the gate electrode 200 while another portion of the seed layer 700 is directly in contact with the first dielectric layer 100. As illustrated in FIG. 7B, the seed layer 700 is sandwiched between the gate electrode 200 and the gate dielectric layer 300. That is, the seed layer 700 is formed on the gate electrode 200 and the first dielectric layer 100 prior to the deposition of the gate dielectric layer 300. In some embodiments, the seed layer 700 is made of metal. For example, the seed layer 700 includes aluminum, titanium, copper, nickel, tungsten, or alloys thereof. In some alternative embodiments, the seed layer 700 is made of nitrides. In some embodiments, the seed layer 700 includes titanium nitride, tantalum nitride, titanium aluminide, or other nitrides. In some embodiments, sidewalls of the seed layer 700 are aligned with sidewalls of the gate dielectric layer 300 and sidewalls of the composite channel layer 400. In some embodiments, with the incorporation of the seed layer 700, the mobility of the composite channel layer 400 may be further increased (i.e. the crystallinity of the crystalline semiconductor oxide layer 404A may be further promoted), thereby enhancing the device performance of the second transistor T2D. In some embodiments, the second transistor T2D may be referred to as a bottom gate transistor or a back gate transistor. In some embodiments, the second transistor T2D in FIG. 7A and FIG. 7B may be utilized as the second transistor T2 in FIG. 1.

In accordance with some embodiments of the disclosure, a transistor includes a first gate electrode, a composite channel layer, a first gate dielectric layer, and source/drain contacts. The composite channel layer is over the first gate electrode. The composite channel layer includes a first capping layer, a crystalline semiconductor oxide layer, and a second capping layer stacked in sequential order. The first gate dielectric layer is located between the first gate electrode and the composite channel layer. The source/drain contacts are disposed on the composite channel layer.

In accordance with some embodiments of the disclosure, an integrated circuit includes a substrate and an interconnection structure. The substrate has a first transistor embedded therein. The interconnection structure is disposed on the substrate and includes dielectric layers and a second transistor. The second transistor includes a first gate electrode, a composite channel layer, a first gate dielectric layer, and source/drain contacts. The first gate electrode is embedded in one of the dielectric layers. The composite channel layer is over the first gate electrode and includes a first capping layer, a crystalline semiconductor oxide layer, and a second capping layer stacked in sequential order. The first gate dielectric layer is located between the first gate electrode and the composite channel layer. The source/drain contacts are disposed on the composite channel layer.

In accordance with some embodiments of the disclosure, a manufacturing method of a transistor includes at least the following steps. A dielectric layer is provided. A first gate electrode is formed in the dielectric layer. A first gate dielectric layer, a first capping layer, a semiconductor oxide layer, and a second capping layer are sequentially deposited over the first gate electrode and the dielectric layer. A crystallinity of the semiconductor oxide layer is altered through a thermal annealing process, so as to form a crystalline semiconductor oxide layer. Source/drain contacts are formed on the second capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
   a first gate electrode;
   a first capping layer, a crystalline semiconductor oxide layer, and a second capping layer sequentially disposed over the first gate electrode, wherein sidewalls of the second capping layer are aligned along a line perpendicular to a top surface of the first gate electrode with sidewalls of the crystalline semiconductor oxide layer;
   a first gate dielectric layer located between the first gate electrode and the first capping layer; and
   source/drain contacts disposed on the second capping layer, wherein the crystalline semiconductor oxide layer and the source/drain contacts are located on two opposite sides of the second capping layer.

2. The transistor of claim 1, wherein a material of the first capping layer and the second capping layer comprises Indium Gallium Zinc Oxide (IGZO).

3. The transistor of claim 1, wherein the first capping layer and the second capping layer comprise silicon dopant.

4. The transistor of claim 1, wherein a material of the crystalline semiconductor oxide layer comprises $Ga_2O_3$, $In_2O_3$, $ZnO$, or $SnO_2$.

5. The transistor of claim 1, further comprising:
   a second gate electrode disposed over the second capping layer; and
   a second gate dielectric layer sandwiched between the second gate electrode and the second capping layer.

6. The transistor of claim 1, further comprising a seed layer sandwiched between the first gate electrode and the first gate dielectric layer.

7. An integrated circuit, comprising:
   a substrate having a first transistor embedded therein; and
   an interconnection structure disposed on the substrate, comprising:
      dielectric layers; and
      a second transistor, comprising:

a first gate electrode embedded in one of the dielectric layers;

a first capping layer, a crystalline semiconductor oxide layer, and a second capping layer sequentially disposed over the first gate electrode, wherein a contour of the second capping layer completely overlaps with a contour of the crystalline semiconductor oxide layer from a top view;

a first gate dielectric layer located between the first gate electrode and the first capping layer; and source/drain contacts disposed on the second capping layer, wherein the crystalline semiconductor oxide layer and the source/drain contacts are located on two opposite sides of the second capping layer.

8. The integrated circuit of claim 7, wherein the interconnection structure further comprises a memory cell embedded in the dielectric layers, and the second transistor is electrically connected to the memory cell.

9. The integrated circuit of claim 7, wherein the dielectric layers comprise a first dielectric layer and a second dielectric layer stacked on the first dielectric layer, the first gate electrode is embedded in the first dielectric layer, and the first gate dielectric layer, the first capping layer, the crystalline semiconductor oxide layer, the second capping layer, and the source/drain contacts are embedded in the second dielectric layer.

10. The integrated circuit of claim 7, wherein the dielectric layers comprise a first dielectric layer and a second dielectric layer stacked on the first dielectric layer, and the first gate electrode, the first gate dielectric layer, the first capping layer, the crystalline semiconductor oxide layer, the second capping layer, and the source/drain contacts are embedded in the second dielectric layer.

11. The integrated circuit of claim 7, wherein the second transistor further comprises:

a second gate electrode disposed over the second capping layer; and a second gate dielectric layer sandwiched between the second gate electrode and the second capping layer.

12. The integrated circuit of claim 7, wherein the second transistor further comprises a seed layer sandwiched between the first gate electrode and the first gate dielectric layer.

13. The integrated circuit of claim 7, wherein a material of the first capping layer and the second capping layer comprises Indium Gallium Zinc Oxide (IGZO).

14. The integrated circuit of claim 7, wherein a material of the crystalline semiconductor oxide layer comprises $Ga_2O_3$, $In_2O_3$, ZnO, or $SnO_2$.

15. A manufacturing method of a transistor, comprising:

providing a dielectric layer;

forming a first gate electrode in the dielectric layer;

sequentially depositing a first gate dielectric layer, a first capping layer, a semiconductor oxide layer, and a second capping layer over the first gate electrode and the dielectric layer;

altering a crystallinity of the semiconductor oxide layer through a thermal annealing process, so as to form a crystalline semiconductor oxide layer;

patterning the first gate dielectric layer, the first capping layer, the crystalline semiconductor oxide layer, and the second capping layer simultaneously such that sidewalls of the second capping layer are aligned along a line perpendicular to a top surface of the first gate electrode with sidewalls of the crystalline semiconductor oxide layer; and forming source/drain contacts on the second capping layer, wherein the crystalline semiconductor oxide layer and the source/drain contacts are located on two opposite sides of the second capping layer.

16. The method of claim 15, wherein the thermal annealing process is performed at a temperature ranging from 300° C. to 600° C. with a duration of 1 minute to 24 hours.

17. The method of claim 15, wherein the thermal annealing process is performed before the second capping layer is deposited.

18. The method of claim 15, wherein the thermal annealing process is performed after the second capping layer is deposited.

19. The method of claim 15, further comprising:

forming a second gate dielectric layer on the second capping layer; and forming a second gate electrode on the second gate dielectric layer.

20. The method of claim 15, further comprising:

forming a seed layer on the first gate electrode and the dielectric layer prior to the deposition of the first gate dielectric layer.

* * * * *